United States Patent
Gloeckner et al.

(10) Patent No.: US 8,783,049 B2
(45) Date of Patent: Jul. 22, 2014

(54) COOLING SYSTEM WITH INDIRECT HUMIDITY DETERMINATION

(75) Inventors: Michael Jason Gloeckner, Galena, OH (US); David V. Larson, Columbus, OH (US)

(73) Assignee: Liebert Corporation, Columbus, OH (US)

( * ) Notice: Subject to any disclaimer, the term of this patent is extended or adjusted under 35 U.S.C. 154(b) by 890 days.

(21) Appl. No.: 12/966,200

(22) Filed: Dec. 13, 2010

(65) Prior Publication Data

US 2011/0146965 A1 Jun. 23, 2011

Related U.S. Application Data

(60) Provisional application No. 61/289,447, filed on Dec. 23, 2009.

(51) Int. Cl.
| | |
|---|---|
| F25B 49/00 | (2006.01) |
| F25D 21/00 | (2006.01) |
| B01F 3/02 | (2006.01) |
| G06F 1/20 | (2006.01) |
| H05K 7/20 | (2006.01) |
| F24F 1/00 | (2011.01) |
| F24F 11/00 | (2006.01) |

(52) U.S. Cl.
CPC ........... *F24F 1/0007* (2013.01); *F24F 11/0015* (2013.01); *H05K 7/20836* (2013.01); *F24F 11/0012* (2013.01)
USPC ....... 62/176.6; 62/150; 236/44 R; 361/679.46

(58) Field of Classification Search
USPC ...... 62/150, 176.6; 236/44 C, 44 R; 165/230; 361/679.46, 690
See application file for complete search history.

(56) References Cited

U.S. PATENT DOCUMENTS

| | | | |
|---|---|---|---|
| 4,512,161 | A | 4/1985 | Logan et al. |
| 4,526,011 | A | 7/1985 | Logan et al. |
| 5,346,129 | A | 9/1994 | Shah et al. |
| 7,155,318 | B2 | 12/2006 | Sharma et al. |
| 2007/0125107 | A1 | 6/2007 | Beam |
| 2008/0066477 | A1 | 3/2008 | Aoki et al. |
| 2008/0104985 | A1 | 5/2008 | Carlsen |
| 2008/0104987 | A1 | 5/2008 | Carlsen et al. |

FOREIGN PATENT DOCUMENTS

| | | |
|---|---|---|
| JP | 53106187 A | 9/1978 |
| RU | 2316759 C2 | 2/2008 |

*Primary Examiner* — Chen Wen Jiang
(74) *Attorney, Agent, or Firm* — Harness, Dickey & Pierce, P.L.C.

(57) ABSTRACT

A cooling system for a data center in which equipment racks are disposed has a cooling unit and a controller coupled to the cooling unit. The cooling system includes temperature sensors at or near the cooling unit's air return inlet, at or near the cooling unit's air supply outlet, and at or near the equipment racks air inlet(s). The controller measures these temperatures. A relative humidity sensor is located at or near the air return inlet of the cooling unit. The relative humidity where the relative humidity sensor is located is measured by the controller using the relative humidity sensor. The controller calculates the dew point temperature from the temperature sensor and relative humidity. Using this dew point, which is essentially constant throughout the space being conditioned, and the temperatures from the other locations, the controller then calculates the relative humidity at each location.

14 Claims, 2 Drawing Sheets

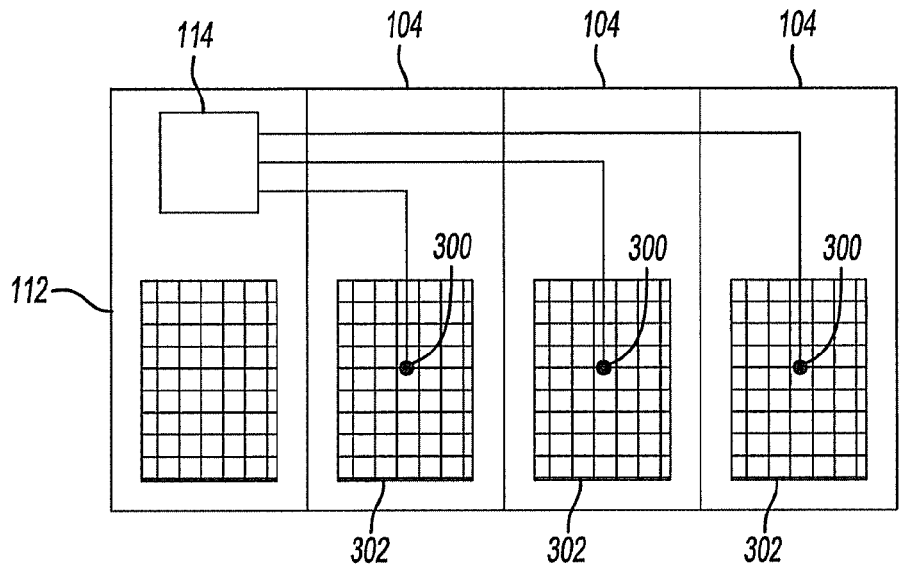
Fig-3
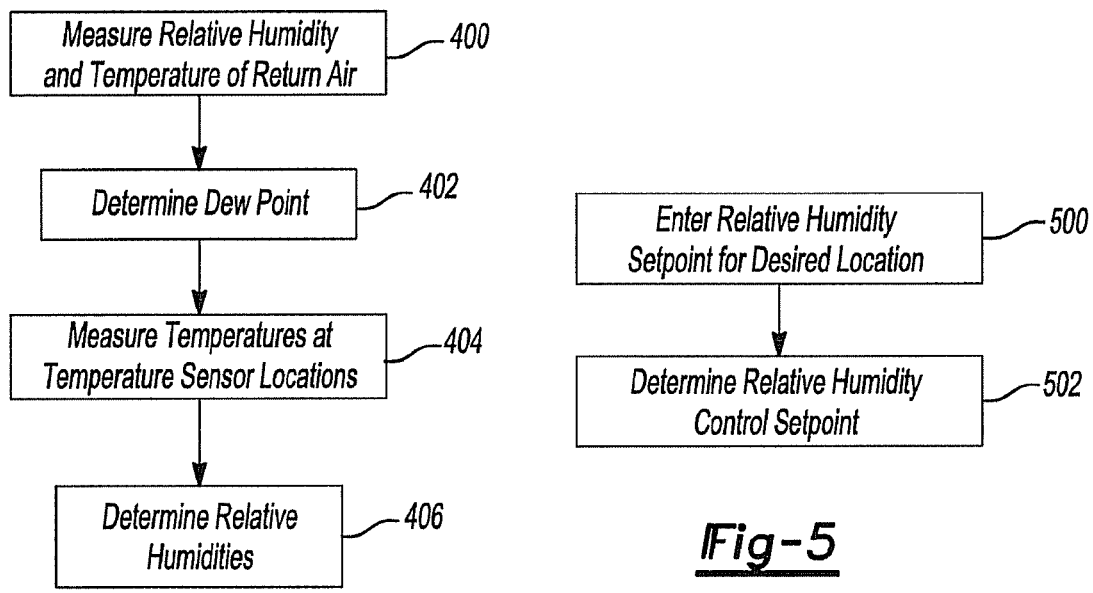
Fig-4
Fig-5

COOLING SYSTEM WITH INDIRECT HUMIDITY DETERMINATION

CROSS-REFERENCE TO RELATED APPLICATIONS

This application claims the benefit of U.S. Provisional Application No. 61/289,447 filed on Dec. 23, 2009. The entire disclosure of the above application is incorporated herein by reference.

FIELD

The present disclosure relates to cooling systems, particularly, to precision cooling systems used to cool areas such as data centers.

BACKGROUND

This section provides background information related to the present disclosure which is not necessarily prior art.

Precision cooling systems, such as those often used in cooling data centers, typically provide precision cooling both of temperature and relative humidity in the space being cooled. These cooling systems may utilize compressorized (air, water, glycol cooled) cooling units and/or chilled water cooling units. Such precision cooling systems often have the capability to operate based on temperature readings from several locations in the space being conditioned. These locations typically include, but are not limited to, the unit's inlet/return air, its discharge/supply air, or the inlets of racks/cabinets containing heat generating I.T. equipment (servers, storage, network switches, etc.). Customarily in precision cooling units, temperature and relative humidity are maintained as a pair for measurements, displays, and desired set points. When an operator of the cooling unit views a temperature from one of these locations, the operator expects that the relative humidity measurement will correspond to this location. Similarly, the desired temperature and relative humidity set points should correspond to this location (return, supply, or rack inlet).

One means of implementing the above measurement and display of temperatures and relative humidity is to place temperature and relative humidity sensors at each of the three (or more in the case of rack sensors) locations. This has a negative impact of increased cost for additional relative humidity sensors. An additional problem is that in some cases, the only practical location for the relative humidity sensor is the return air of the unit. This will rarely provide a correct unadjusted relative humidity reading relative to the other temperature sensor readings. The humidity at the supply (discharge) of the unit will vary significantly depending on the operating mode of the unit. This makes the unit supply a poor location for a relative humidity sensor. An alternative is to provide only one relative humidity sensor and have the user place the sensor at the correct location. This invites the problem of incorrect or less than optimal placement of the sensors.

SUMMARY

This section provides a general summary of the disclosure, and is not a comprehensive disclosure of its full scope or all of its features.

In accordance with an aspect of the present disclosure, a cooling system for an area has a cooling unit and a controller coupled to the cooling unit. The cooling system includes temperature sensors at or near the cooling unit's air return inlet, at or near the cooling unit's air supply outlet, and at or near the equipment racks air inlet(s). The controller measures these temperatures. Rack air inlet temperatures may be averaged or the maximum temperature among a group of racks may be used. A relative humidity sensor is located at or near the air return inlet of the cooling unit near its return air side. The relative humidity where the relative humidity sensor is located is measured by the controller using the relative humidity sensor. The controller calculates the dew point temperature from the temperature sensor and relative humidity sensor located at or near the return air side of the cooling unit. Using this dew point, which is essentially constant throughout the space being conditioned, and the temperatures from the other locations (such as the cooling unit air supply outlet and air inlets of the racks), the controller then calculates the relative humidity at each location.

In an aspect, the relative humidity sensor is located in the cooling unit near the air return inlet of the cooling unit.

In an aspect, the relative humidity sensor is located at a location in the data center outside of the cooling unit.

In an aspect, the relative humidities are displayed on an LCD display coupled to the controller in reference to the corresponding locations, and with the corresponding temperatures. Because the dew point in the conditioned space is fairly constant, the relative humidities calculated are accurate representations of the actual relative humidity at each location.

In an aspect, the controller is a computer based control system programmed with software to determine the relative humidities at each location where a temperature sensor is located. In an aspect, the computer based control system is a microprocessor based control system.

In an aspect, when an operator enters a desired relative humidity set point into the controller, the operator will do so based on the location of the desired set point (such as unit return, unit supply, or rack inlet). The controller then calculates the equivalent relative humidity set point to be used to control relative humidity at that location, based on the dew point, and the temperature measured at the desired location.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure. Corresponding reference numerals indicate corresponding parts throughout the several views of the drawings.

FIG. 3 is a diagram front-view of a row of equipment racks and supply air side outlet of a cooling unit of FIG. 1 viewed from the cold aisle of FIG. 1;

Figure 1:
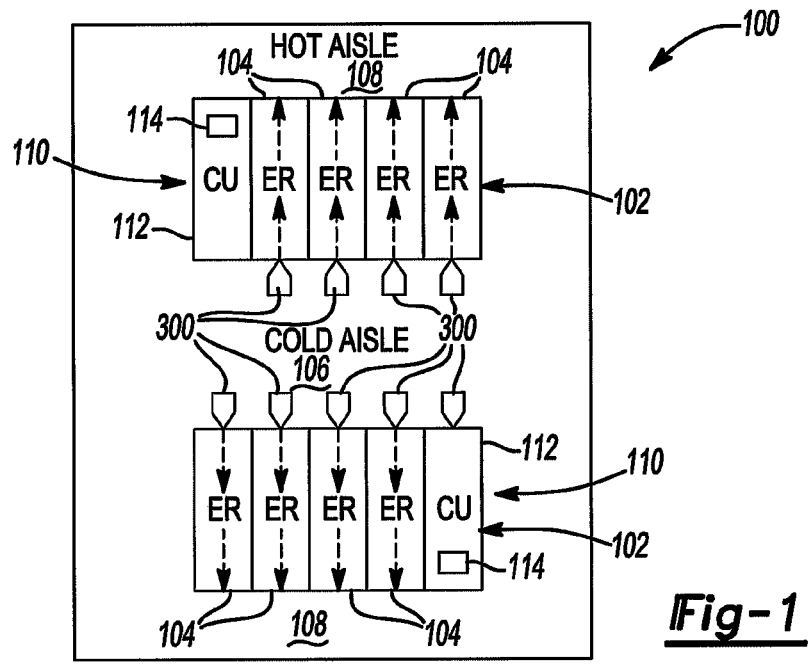
FIG. 1 is a diagram top-view of a data center in accordance with an aspect of the present disclosure having equipment racks and cooling units arranged in rows in a hot aisle/cold aisle configuration.

FIG. 4 is a flow chart of a control program for a controller of the cooling unit of FIG. 1 by which the controller determines relative humidity at locations having a temperature sensor but not a humidity sensor; and FIG. 5 is a flow chart of a control program for a controller of the cooling unit of FIG. 1 by which the controller determines an internal relative humidity control set point equivalent to a relative humidity set point for a desired location entered by an operator.

DETAILED DESCRIPTION

Example embodiments will now be described more fully with reference to the accompanying drawings.

FIG. 1 shows a data center 100 having rows 102 of equipment racks 104 arranged in a hot aisle/cold aisle configuration. The equipment racks 104 draw in cool air through their front faces from the cold aisle 106 and exhaust hot air from their back faces to hot aisle 108. FIG. 1 shows two rows 102 of equipment racks 104 with the fronts of the equipment racks 104 in the two rows 102 facing each other across the cold aisle 106. It should be understood that data center 100 could have several rows of equipment racks 102 arranged so that there are several cold and hot aisles 106, 108.

Data center 100 includes a cooling system 110 that illustratively includes one or more precision cooling units 112 disposed in one or more of rows 102 of equipment racks 104. In the illustrative embodiment of FIG. 1, one cooling unit 112 is disposed in each of the two rows 102 at opposite ends of the rows 102. It should be understood that cooling system 110 might have only one cooling unit 112, or that it have a plurality of cooling units 112 in each of equipment rows 102. It should also be understood that cooling units 112 could be located other than at ends of equipment rows 102, such as between equipment racks 102 in equipment rows 102.

Figure 2:
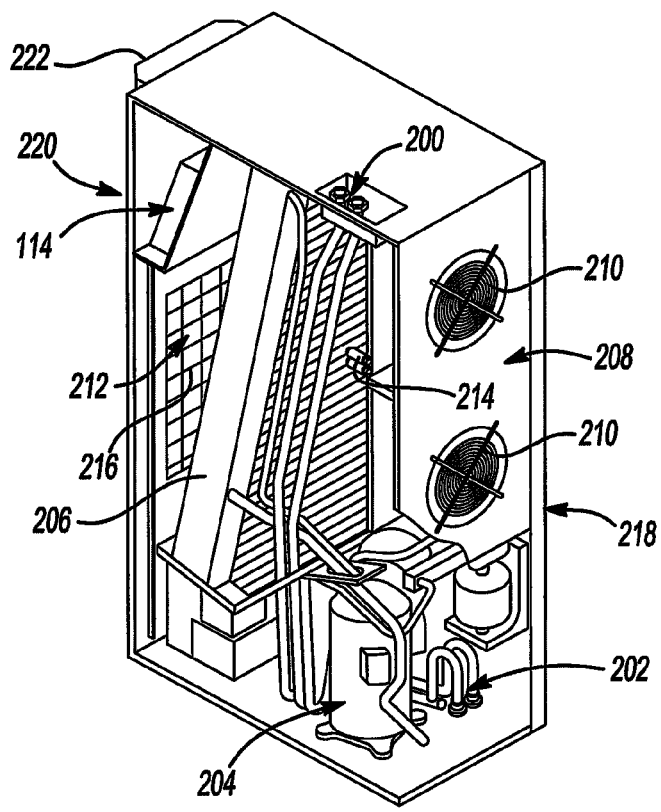
FIG. 2 is a perspective view of a cooling unit in accordance with an aspect of the present disclosure.

With reference to FIG. 2, an example cooling unit 112 is shown, which is illustratively a compressorized (water/glycol cooled) type of cooling unit. Cooling unit 112 includes top and bottom cooling water connections 200, 202, a compressor 204, a cooling coil 206 or heat exchanger 206, an air return inlet 208 (which illustratively includes inlet fans 210), an air supply outlet 212, an air return relative humidity/temperature sensor 214, and controller 114. Air return inlet 208 is located at a rear or back face 218 of cooling unit 112 and air supply outlet 212 is located at a front face 220 of cooling unit 112. Sensor 214 may illustratively be located between air return inlet 208 and cooling coil 206, such that air drawn in through air return inlet 208 flows past sensor 214 before it passes through cooling coil 206. Cooling unit 112 also illustratively includes an air supply temperature sensor 216 located between an outlet of cooling coil 206 and air supply outlet 212. Air supply temperature sensor 216 could also be located on a front face of cooling unit 112 adjacent air supply outlet 212.

Although cooling unit 112 is shown as being a compressorized (water/glycol) type of cooling unit, it should be understood that it can also be a compressorized (air cooled) type of cooling unit or a chilled water type of cooling unit. Further, in cooling systems 110 having a plurality of cooling units 112, the cooling units 112 can be different ones of the above types of cooling units.

It should be understood that sensor 214 is any type of sensor that senses dry bulb temperature and a parameter indicative of relative humidity, such as relative humidity or wet bulb temperature as appropriate. Sensor 214 may be a combined sensor that senses both dry bulb temperature and a parameter indicative of relative humidity. Sensor 214 may be two separate sensors, one that senses dry bulb temperature and one that senses the parameter indicative of relative humidity. By way of example and not of limitation, sensor 214 may illustratively be a sensor having part number 181464G3 available from Liebert Corporation of Columbus, Ohio. Air supply temperature sensor 216 may illustratively be a temperature sensor that measures dry bulb temperature, such as a thermistor, and may illustratively be a temperature sensor having part number 148039P1 available from Liebert Corporation of Columbus, Ohio.

With reference to FIGS. 1 and 3, controller 114 of each cooling unit 112 has inputs coupled to one or more temperature sensors 300 located external of cooling unit at locations within data center 100. Illustratively temperature sensors 300 are located at air inlets 302 of equipment racks 104. In this regard, a cooling unit 112 may be associated with one or more equipment racks 104 with temperature sensors 300 at the air inlets 302 of those associated equipment racks coupled to the inputs of the controller 114 of that cooling unit 112. Temperature sensors 300 may illustratively be a temperature sensor having part number 181464G3 available from Liebert Corporation of Columbus, Ohio.

Controller 114 of a cooling unit 112 determines the relative humidity at the locations of the temperature sensors 300 coupled to controller 114 and at the air supply temperature sensor 116 coupled to controller 114 based upon the temperature readings of the sensor(s) and a dew point temperature that it determines from the relative humidity and dry bulb temperature of the air that it measures with air return relative humidity/temperature sensor 214. The locations having only temperature sensors and not relative humidity sensors are referred to herein as "Temp Sensor Locations." Controller 114 may then display these relative humidities (and other information such as the dry bulb temperatures) on a display, such as a display 222 of controller 114, an external display (not shown), and may also transmit these relative humidities and other data, such as measured temperatures, to a remote system (not shown).

With reference to the flow chart of FIG. 4 which illustrates a software program for controller 114 to determine the relative humidities at these various locations, controller 114 first measures at 400 the temperature and relative humidity of the return air at the air return inlet using air return humidity/temperature sensor 214. At 402, controller 114 calculates the dew point of the air return air using the following equations:

$$SDD\_T = C*10\text{EXP}((A*\text{Temp})/(B+\text{Temp})) \quad (1)$$

where SDD_T is saturation steam pressure in hPa, Temp is temperature of the return air in Celsius, A=7.5 and B=237.3

$$DD\_rH\_T = (\text{rel\_Hum}/100)*SDD\_T \quad (2)$$

where DD_rH_T is steam pressure in hPa $$v\_rH\_T = \log 10(DD\_rH\_T/C) \quad (3)$$

where C is 6.1078

$$TD\_rH\_T = B*v\_rH\_T/(A - v\_rH\_T) \quad (4)$$

where TD_rH_T is the dew point temperature in Celsius, and A and B have the values given in (1) above.

At 404, controller 114 measures the temperatures at the Temp Sensor Locations using temperature sensors 300 and temperature sensor 216. At 406, controller 114 determines the relative humidity at each of the Temp Sensor Locations by using the temperature measured at each of these locations, the determined dew point temperature and by the above equations.

While the foregoing example utilizes relative humidity sensor/temperature sensor 214 located at the air return inlet, it should be understood that the relative humidity sensor/temperature sensor 214 can be located at other locations. By way of example and not of limitation, the relative humidity sensor/ temperature sensor 214 could be located in data center 100 in proximity to cooling unit 112, such as in cold aisle 106 or hot aisle 108.

In addition to displaying the relative humidities determined for the Temp Sensor Locations, these relative humidities can be used by controller 114 in controlling the relative humidities at the Temp Sensor Locations. When an operator enters a desired relative humidity set point into controller 114, the operator can do so based on the location of the Temp Sensor Locations since the relative humidity can be determined for the Temp Sensor Locations even though the Temp Sensor Locations do not have a relative humidity sensor. With reference to FIG. 5, at 500 the operator enters the desired relative humidity set point for the desired location. At 502, controller 114 determines, using the above equations, an equivalent relative humidity set point (referred to as a "control set point" in FIG. 5) for the location where relative humidity is being measured, to which controller 114 will control cooling unit 112.

While the foregoing is described with regard to a data center having a cooling system with cooling units 112 located in rows 102 of equipment racks 104, it should be understood that the use of the foregoing is not limited to cooling systems having cooling units located in rows of equipment racks. It could also be used, by way of example and not of limitation, for cooling systems having cooling units located other than in rows of equipment racks, or cooling units used in data centers having raised floor configurations where the cooled air supply from the cooling unit flows beneath the raised floor and up through floor vents into the cold aisle(s).

The foregoing provides the advantages of eliminating the need for multiple relative humidity sensors. This reduces cost making it more cost feasible to use a higher accuracy relative humidity sensor for the relative humidity sensor that is used since higher accuracy relative humidity sensors are higher in cost than lower accuracy sensors. It also simplifies the control software in that the control software need deal with only one relative humidity sensor and thus does not need to reconcile measurements from multiple relative humidity sensors. It also allows more precise control of relative humidity at the various Temp Sensor Locations avoiding unneeded humidification/dehumidification.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A cooling system for a data center having equipment racks disposed therein, the equipment racks having electronic equipment therein, the cooling system comprising:
   a cooling unit;
   a controller coupled to the cooling unit;
   a temperature sensor disposed near an air inlet of each equipment rack at which relative humidity is to be calculated by the controller ("Temp Sensor Location"), each temperature sensor coupled to the controller;
   a relative humidity sensor disposed to sense relative humidity at a location in the data center or near an air return inlet of the cooling unit and an associated temperature sensor disposed with the relative humidity sensor, the relative humidity sensor and associated temperature sensor coupled to the controller;
   the controller measuring with the relative humidity sensor relative humidity at the location at which the relative humidity sensor is disposed and measuring with the associated temperature sensor disposed with the relative humidity sensor a temperature of air thereat;

the controller calculating a dew point based on the measured relative humidity and temperature of air measured at the relative humidity sensor;

the controller measuring with the temperature sensor at each Temp Sensor Location a temperature of air at each Temp Sensor Location and indirectly determining a relative humidity thereat by calculating the relative humidity thereat based on the temperature of air measured at that Temp Sensor Location and the calculated dew point.

2. The system of claim 1 wherein the air inlet of each equipment rack is a Temp Sensor Location and has one of the temperature sensors disposed thereat.

3. The system of claim 2 wherein a location near an air supply outlet of the cooling unit is also a Temp Sensor Location and has a temperature sensor disposed thereat.

4. The system of claim 3 including a display coupled to the controller on which the relative humidities can be displayed.

5. The system of claim 3 wherein the controller controls the cooling unit to control a relative humidity at one or more of the Temp Sensor Locations, the controller calculating a control relative humidity set point for each such Temp Sensor Location based on a relative humidity set point for the Temp Sensor Location entered into the controller, the calculated dew point and the temperature of air measured at that Temp Sensor Location, the controlling controller controlling the cooling unit to control the relative humidity at that Temp Sensor Location based on the calculated control relative humidity set point for that Temp Sensor Location and the relative humidity at that Temp Sensor Location calculated by the controller.

6. The system of claim 1 wherein the relative humidity sensor and associated temperature sensor are disposed in the cooling unit near the air return inlet of the cooling unit.

7. The system of claim 1 wherein the relative humidity sensor and associated temperature sensor are a combined sensor.

8. In a data center having equipment racks disposed therein, the equipment racks having electronic equipment therein and a cooling unit for cooling the data center, a method of indirectly determining relative humidity at one or more locations in the data center having a temperature sensor disposed thereat but not a relative humidity sensor ("Temp Sensor Locations"), each temperature sensor disposed at a Temp Sensor Location coupled to a controller, the method comprising:

measuring with a controller and a relative humidity sensor coupled to the controller and disposed at a location in the data center or near an air return inlet of the cooling unit the relative humidity at the location where the relative humidity sensor is disposed;

measuring with the controller and a temperature sensor coupled to the controller and disposed at the location where the relative humidity sensor is disposed a temperature of air at that location;

calculating with the controller a dew point based on the measured relative humidity and the temperature of air measured at the location where the relative humidity sensor is disposed;

measuring with the controller and the temperature sensor at each Temp Sensor Location a temperature of air at each Temp Sensor Location;

indirectly determining the relative humidity at each Temp Sensor Location by calculating with the controller the relative humidity based on the calculated dew point and temperature of air measured at that Temp Sensor Location.

9. The method of claim 8 wherein the Temp Sensor Locations include air inlets of the equipment racks.

10. The method of claim 8 wherein the Temp Sensor Locations include an air supply outlet of the cooling unit.

11. The method of claim 8 wherein measuring the relative humidity and the temperature of the air at the location at which the relative humidity sensor is disposed includes measuring the relative humidity and the temperature of air near an air return inlet of the cooling unit.

12. The method of claim 11 wherein measuring the relative humidity and the temperature of the air near the air return inlet of the cooling unit includes measuring the relative humidity and the temperature of air in the cooling unit near the air return inlet of the cooling unit.

13. The method of claim 8 including displaying the relative humidities on a display coupled to the controller.

14. The method of claim 8 including controlling the cooling unit with the controller to control relative humidity at one or more of the Temp Sensor Locations by calculating with the controller a control relative humidity set point for each such Temp Sensor Location based on a relative humidity set point for the Temp Sensor Location entered into the controller, the calculated dew point and the temperature of air measured at that Temp Sensor Location, and controlling the cooling unit with the control to control the relative humidity at that Temp Sensor Location based on the calculated control relative humidity set point for that Temp Sensor Location and the relative humidity at that Temp Sensor Location calculated by the controller.

* * * * *